US009502681B2

(12) United States Patent
Hack et al.

(10) Patent No.: US 9,502,681 B2
(45) Date of Patent: Nov. 22, 2016

(54) SYSTEM AND METHOD FOR A FLEXIBLE DISPLAY ENCAPSULATION

(71) Applicants: Michael Hack, Princeton, NJ (US); Julia J. Brown, Yardley, PA (US)

(72) Inventors: Michael Hack, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/719,262

(22) Filed: Dec. 19, 2012

(65) Prior Publication Data

US 2014/0166992 A1  Jun. 19, 2014

(51) Int. Cl.
*H01L 29/08* (2006.01)
*H01L 51/52* (2006.01)
*H01L 51/00* (2006.01)

(52) U.S. Cl.
CPC ....... *H01L 51/5253* (2013.01); *H01L 51/0097* (2013.01)

(58) Field of Classification Search
CPC ... H01L 51/52; H01L 51/56; H01L 51/0097; H01L 51/5253
USPC ............... 257/40; 345/76; 313/512; 136/256
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,664,137 B2 | 12/2003 | Weaver |
| 6,835,950 B2 | 12/2004 | Brown et al. |
| 7,050,835 B2 | 5/2006 | Hack et al. |

(Continued)

FOREIGN PATENT DOCUMENTS

| | | |
|---|---|---|
| CN | 102598158 A | 7/2012 |
| EP | 1143539 | 10/2001 |

(Continued)

OTHER PUBLICATIONS

Baldo et al.,"Highly efficient phosphorescent emission from organic electroluminescent devices", Nature, vol. 395, pp. 151-154, 1998.
Baldo et al.,"Very high-efficiency green organic light-emitting devices based on electrophosphorescence", Applied Physics Letter, vol. 75, No. 1, pp. 4-6, 1999.
First Office Action for CN 201310680749.0, dated Jul. 29, 2016.

*Primary Examiner* — Mohammed Shamsuzzaman
(74) *Attorney, Agent, or Firm* — Morris & Kamlay LLP

(57) ABSTRACT

Provided is an OLED device that is rollable and has a rollable protective covering to protect the OLED when rolled. The rollable protective covering may include a single layer barrier and a plastic lid. The single layer barrier may provide permeation protection to the OLED in the OLED device. The protective covering provides mechanical protection to the OLED device when rolled. The protective covering and the OLED may be fabricated separately and assembled afterwards.

11 Claims, 6 Drawing Sheets

(56) References Cited

U.S. PATENT DOCUMENTS

| | | |
|---|---|---|
| 7,279,704 B2 | 10/2007 | Walters et al. |
| 7,431,968 B1 | 10/2008 | Shtein et al. |
| 7,968,146 B2 | 6/2011 | Wagner et al. |
| 2003/0071569 A1 | 4/2003 | Chung et al. |
| 2003/0230980 A1 | 12/2003 | Forrest et al. |
| 2004/0160178 A1* | 8/2004 | Qiu .................... H01L 51/5256 313/512 |
| 2004/0174116 A1 | 9/2004 | Lu et al. |
| 2008/0042940 A1* | 2/2008 | Hasegawa ............... G02F 1/167 345/76 |
| 2008/0102223 A1 | 5/2008 | Wagner et al. |
| 2008/0237181 A1* | 10/2008 | Wagner et al. ................ 216/13 |
| 2010/0264817 A1* | 10/2010 | Bouten ............ G02F 1/133305 313/512 |
| 2010/0308335 A1* | 12/2010 | Kim .................... H01L 27/3244 257/59 |
| 2011/0132449 A1* | 6/2011 | Ramadas ............... H05B 33/04 136/256 |
| 2011/0156353 A1* | 6/2011 | Kabutoya ............. C09J 7/0246 277/312 |

FOREIGN PATENT DOCUMENTS

| | | |
|---|---|---|
| JP | 2010-252356 | 11/2010 |
| WO | 2006/107379 | 10/2006 |
| WO | 2008/057394 | 5/2008 |
| WO | 2008057394 | 5/2008 |
| WO | 2009136305 A1 | 11/2009 |
| WO | 2010/011390 | 1/2010 |
| WO | 2010011390 | 1/2010 |

\* cited by examiner

SYSTEM AND METHOD FOR A FLEXIBLE DISPLAY ENCAPSULATION

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to OLEDs and, more specifically, to OLED devices that have a flexible protective barrier.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

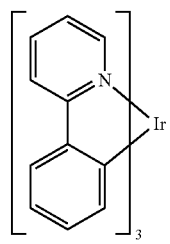

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

An OLED device that is rollable and has a protective covering to protect the OLED when rolled is provided. The protective covering and the OLED may be fabricated separately and assembled afterwards.

In an embodiment of the invention disclosed herein, a rollable device may include a rollable OLED and a rollable barrier coated plastic lid. The barrier coated plastic lid may be laminated on to the rollable OLED, and may include a single layer barrier and an optional rollable hardcoat.

In an embodiment of the invention disclosed herein, the rollable OLED may be a display.

In an embodiment of the invention disclosed herein, the single layer barrier may provide a permeation barrier between the flexible OLED and the flexible hardcoat.

In an embodiment of the invention disclosed herein, a method for fabricating a rollable device is provided. The fabrication method may include obtaining a rollable plastic lid. A rollable single layer barrier may be deposited on the plastic lid. The rollable plastic lid with the single layer barrier may be laminated on to a rollable OLED.

In an embodiment of the invention disclosed herein, the rollable OLED may be a display, a light source, or both.

In different embodiments of the invention disclosed herein, the rollable OLED may be incorporated into a flat panel display, a computer monitor, a medical monitor, a television, a billboard, lights for interior or exterior illumination and/or signaling, a heads up display, a fully transparent display, a flexible display, a laser printer, a telephone, a cell phone, a personal digital assistant (PDA), a laptop computer, a digital camera, a camcorder, a viewfinder, a micro-display, a vehicle, a large area wall, a theater, a stadium screen, a sign or the like.

DETAILED DESCRIPTION

The presently disclosed system and method overcome the lack of an effective flexible permeation layer by providing a single layer barrier that may also act as a protective film. The single layer barrier may be applied to a plastic lid, and the combination may be laminated to an OLED. With the single layer barrier and plastic film in place, the rollable OLED device may be wound upon itself for at least one complete revolution. The protective film protects the OLED from being damaged when the OLED device is rolled.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
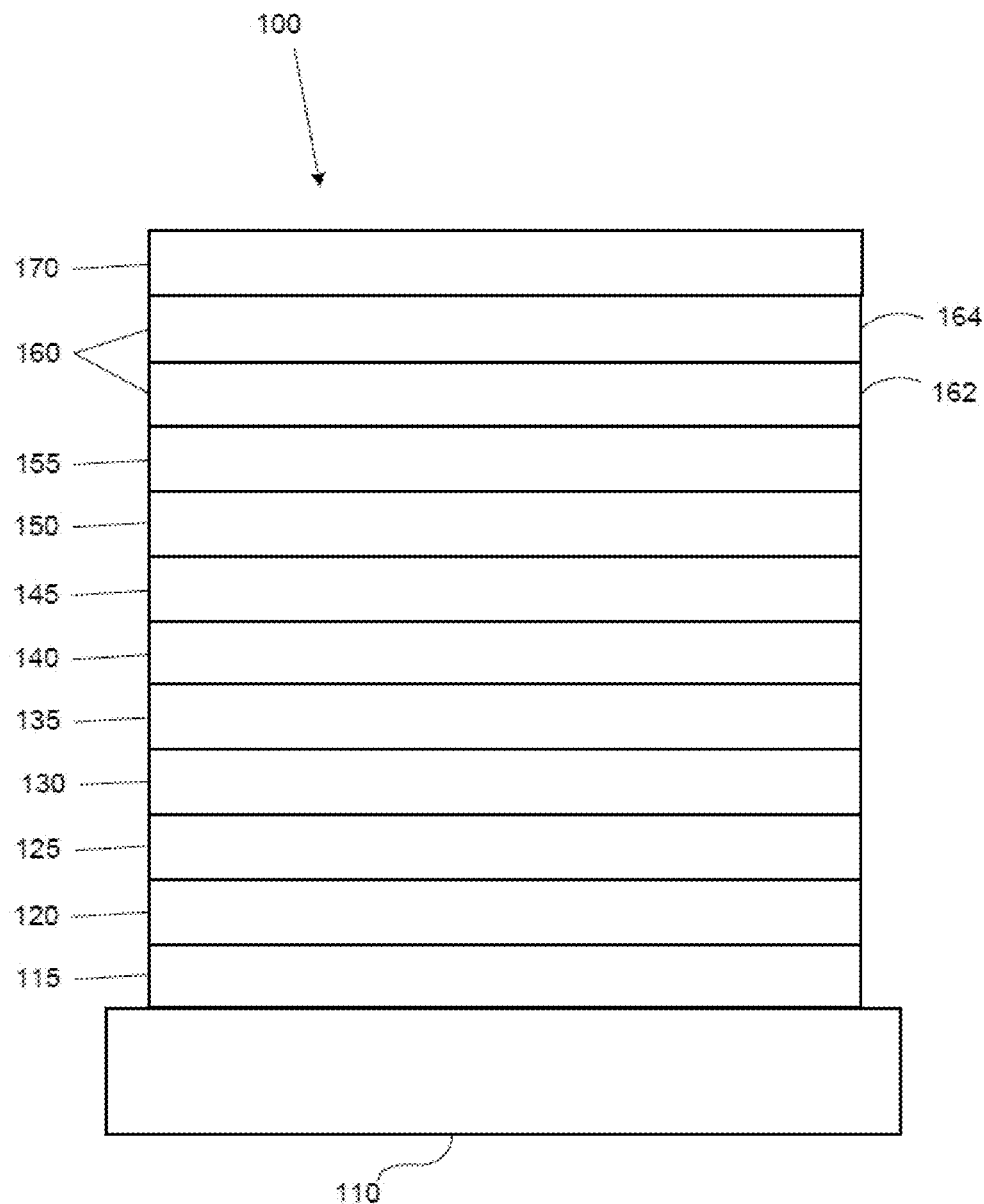
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The substrate layer 110 can be a rigid or flexible layer. It is preferably a flexible layer and is typically selected based on one or more characteristics, such as flexibility and conformability to other surfaces, dimensional stability during processing (e.g., where web-based processing is contemplated), adequate bonding with other components such as the cooperative barrier layers of the barrier region 170, and optical characteristics. Preferred flexible substrate layers contain paper, fabric, metal foil, flexible glass layers (available, for example, from Schott Glass Technologies), and/or polymer layers. More preferred flexible layers are layers that comprise one or more of the polymer components, including polyesters, polycarbonates, polyethers, polyimides, polyolefins, and fluorocarbons that are capable of providing a strong adhesive bond with other materials. Such components can be found, for example, in homopolymers, copolymers and polymer blends. Examples of some preferred polymer components include, for example, polyethersulphones, polyarylates, polyestercarbonates, polyethylenenaphthalates, polyethyleneterephthalates, polyetherimides, polyacrylates, Kapton® polyimide film available from DuPont, Appear® PNB (polynorbornene) available from BF Goodrich, Aclar® fluoropolymer available from Honeywell, and Arton® available from BF Goodrich. The substrate layer 110 may range from 25 microns to 1 millimeter in thickness.

Figure 2:
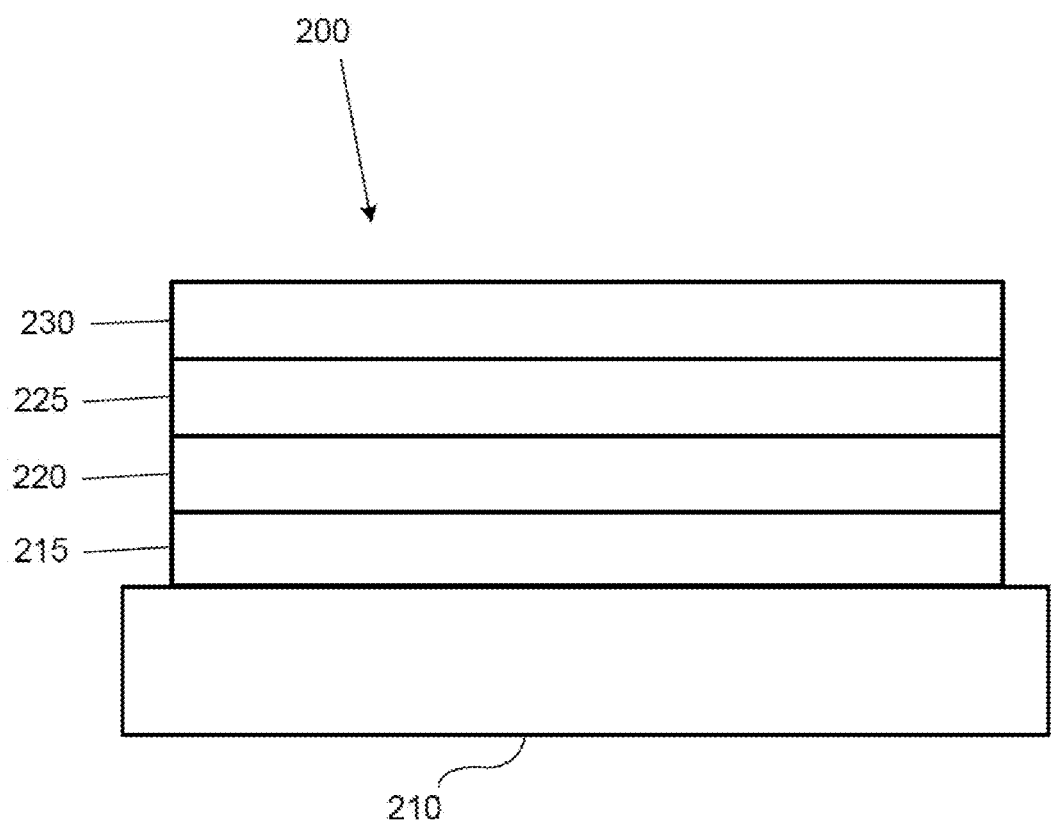
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

Preferably, the light emitting elements of the OLEDs shown in FIGS. 1 and 2 are high efficiency, organic light emitting devices that use phosphorescent emitters such as disclosed in U.S. Pat. No. 6,303,238 B1, which is hereby incorporated herein by reference in its entirety. Fluorescent emitters, such as those disclosed in U.S. Pat. Nos. 4,539,507, 4,769,292, and 5,294,870 can also be used. The organic layers of the organic light emitting devices can include small molecular (i.e., non-polymeric, unlinked) materials or large molecular (i.e., polymeric, linked) materials. The organic light emitting device can be ordinary, side by side OLEDs, transparent OLEDS (TOLEDs), or stacked (i.e., multiple resolution) OLEDs (SOLEDs). Examples of TOLEDs are described in U.S. Pat. No. 5,703,436, the contents of which are hereby incorporated herein by reference. Examples of SOLEDs are described in U.S. Pat. No. 5,707,745, the contents of which are hereby incorporated herein by reference.

The simple layered structures illustrated in FIGS. 1 and 2 are provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

It may be desirable to provide a protective or similar layer on an outside surface of an OLED device, to prevent moisture or foreign materials from coming into contact with the OLED or layers therein. The requirements for the thin film encapsulation on an OLED become more stringent as the flexibility of the OLED increases. The industry has struggled in its attempts to provide highly effective thin film encapsulation that provides acceptable flexibility. Not only must the encapsulation provide an effective permeation barrier that withstands moisture and oxygen, but it must also provide protection from mechanical damage and withstand repetitive flexing. A conventional approach is to use a multi-layer encapsulation layer applied to the lid as a permeation barrier. In some configurations, a single inorganic layer may be used. However, a single inorganic layer typically cannot provide an adequate permeation barrier, because it will crack when flexed if made at a thickness desirable to prevent particulates from entering the device. Conventional encapsulation layers also employ multi-layer thin film encapsulation to provide a flexible permeation layer. However, each of the multiple layers typically has different mechanical properties, such as different coefficients of expansion, so high internal stresses may develop when the multi-layer film is flexed. Thus, conventional multi-layer barriers typically cannot be readily flexed and taken through thermal cycling without causing significant internal stresses and delamination issues.

In contrast, embodiments of the invention as disclosed herein provide a rollable protective covering that includes a single layer barrier and a plastic lid. The covering may provide permeation protection as well as mechanical protection to an attached OLED device when the device is rolled. Advantageously, the protective covering and the OLED may be fabricated separately and assembled afterwards.

Figure 3:
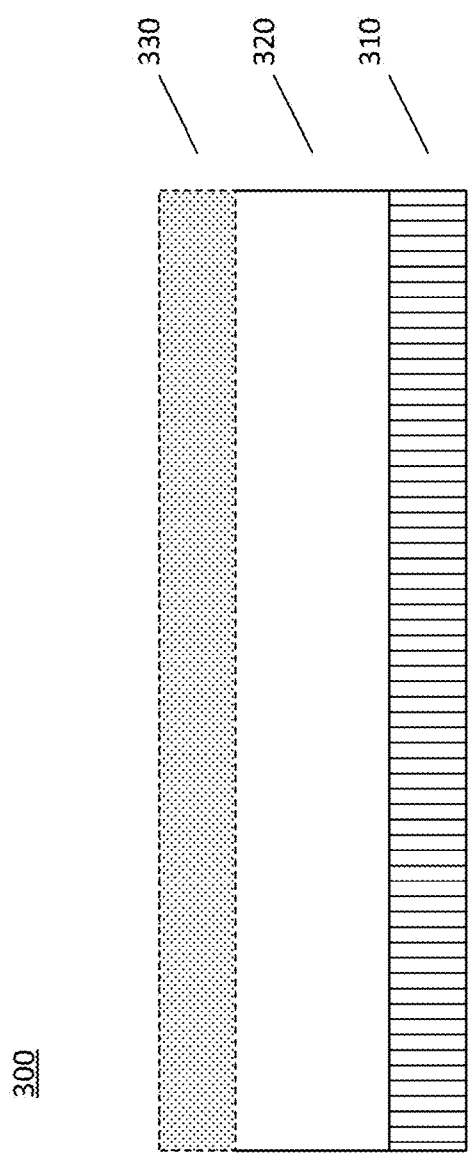
FIG. 3 shows a barrier coated plastic lid according to an embodiment of the present invention.

FIG. 3 shows a barrier coated plastic lid according to an embodiment of the present invention. FIG. 3 is not drawn to scale. The barrier coated plastic lid 300 may include a single layer barrier 310, a plastic lid 320 and an optional hardcoat 330. The barrier coated plastic lid 300 may be flexible such that it has a radius of curvature that allows it to be rollable, and may be transparent. Preferably, the barrier coated plastic lid 300 may not substantially distort images generated by a light emitting portion of an OLED. The barrier coated plastic lid 300 may be fabricated separately from the OLEDs illustrated in FIGS. 1 and 2.

A purpose of the single layer barrier 310 may be to provide a permeation barrier that protects the electrodes and organic layers from damaging exposure to harmful species in the environment including moisture, vapor and/or gases, etc. The single layer barrier 310 may be formed by various known chemical vapor deposition techniques and may include compositions having a single phase as well as compositions having multiple phases. Any suitable material or combination of materials may be used for the single layer barrier 310 so long as the barrier remains rollable. The single layer barrier 310 may incorporate an inorganic or an organic compound or both. In certain embodiments, the single layer barrier may have a permeation to water of less than $10^{-5}$ g/m$^2$/day. In some configurations, a preferred single layer barrier 310 comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the single layer barrier 310 should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon. The single layer barrier 310 may be deposited over, under or next to a substrate, an electrode, or over any other parts of a device including an edge.

The plastic lid 320 may consist of thin film inorganic materials, such as Al, SiO$_x$, AlO$_x$, and Si$_3$N$_4$ vacuum deposited on polymeric substrates or the single layer barrier. Typically, a plastic film coating on PET reduces oxygen permeability to levels of about 0.1 to 1.0 cc/m$^2$/day, and water vapor permeability to about 0.1 to 1.0 g/m$^2$/day, which is insufficient for many display devices. More details related to plastic film barrier coatings in the context of OLEDs can be found, in U.S. Pat. No. RE40531, the disclosure of which is incocrporated by reference in its entirety. The single layer barrier 310 may be a barrier coating that may be applied to the plastic lid 320 to further reduce gas and liquid permeability of the OLED.

The optional hardcoat 330 may provide an additional level of mechanical protection from scratching and other physical damage to the OLED in addition to the plastic lid 320 and the single layer barrier 310 alone. The optional hardcoat 330 may or may not be included when the plastic lid 300 is fabricated. The hardcoat 330 may also be flexible and rollable to substantially match the radius of curvature of the plastic film 320 and the single layer barrier 310. The hardcoat 330 may be manufactured from any suitable material, including plastic materials. The barrier coated plastic lid 300 may be manufactured using processes and machinery different from those used to fabricate the OLED devices of FIGS. 1 and 2. Thus, fabrication of a device as disclosed herein may be less complex and costly than conventional techniques for fabricating a protected device, since the lid may be manufactured in a separate process and later combined with the remaining components of the device. In addition, using separate fabrication techniques may avoid damage to the OLED or individual layers fabricated during fabrication of the OLED. The barrier coated plastic lid may be laminated to the OLED using any suitable adhesive, such as Pressure Sensitive Adhesives (PSA), epoxy, optically clear adhesive, and other adhesives.

Figure 4:
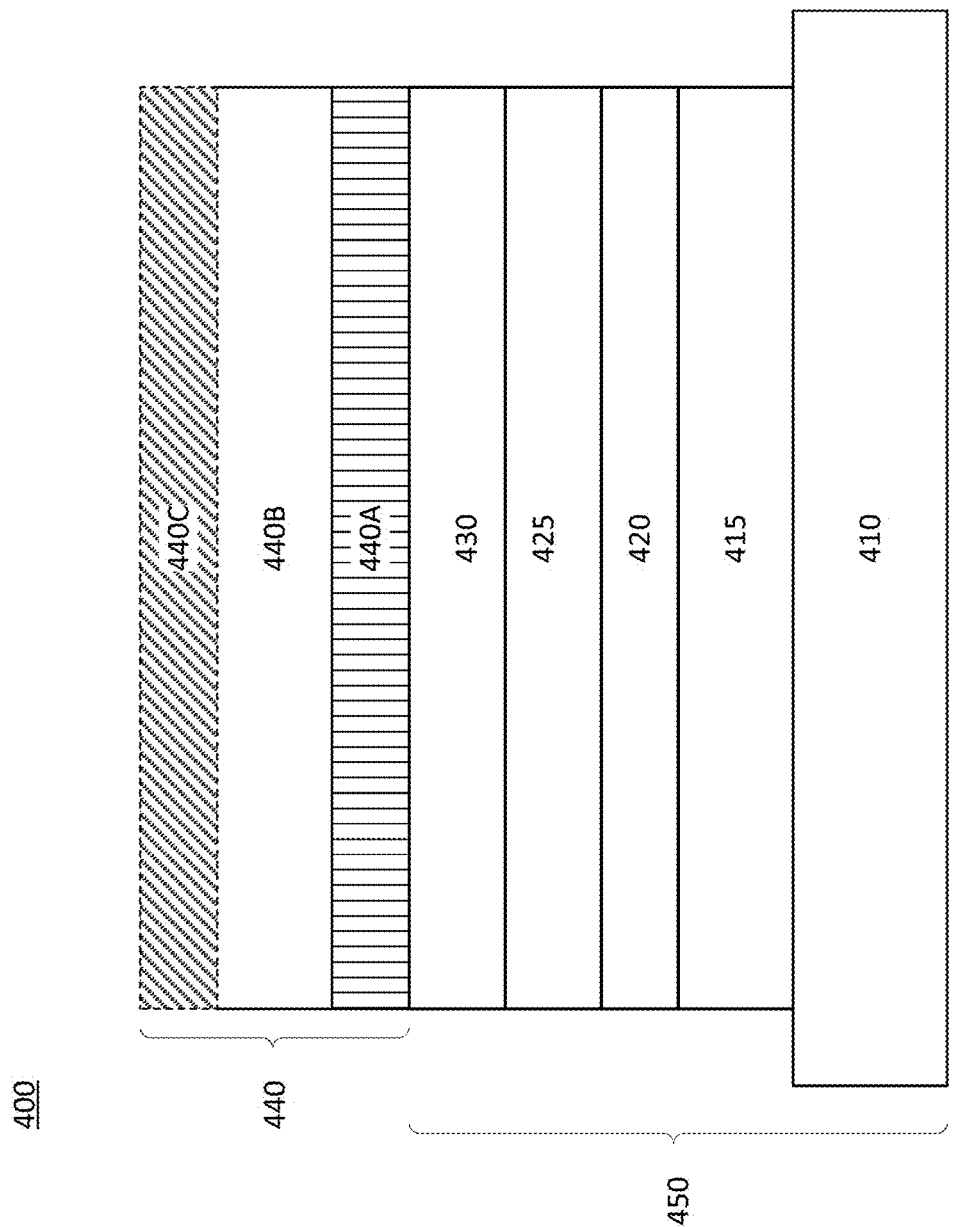
FIG. 4 shows an OLED including a barrier coated plastic lid according to an embodiment of the present invention.

FIG. 4 shows an OLED including a barrier coated plastic lid according to an embodiment of the present invention. The OLED device 400 may include an OLED 450 and a single layer barrier plastic lid 440. The OLED 450 may include a substrate 410, an anode 415, a hole transport layer 420, an emissive layer 425, a cathode 430. The OLED 450 formed from layers 410-430 may be fabricated as described in FIG. 1. For example, OLED 450 may be fabricated by depositing the layers 410-430, in order. Materials similar to those described with respect to device 100 of FIG. 1 may be used in the corresponding layers of device 400. The arrangement of layers 430-415 may be altered to provide an inverted OLED as described with respect to FIG. 2. In which case, the barrier coated plastic lid 440 may remain against the anode 415.

The barrier coated plastic lid 440 may include a single layer barrier 440A, a plastic lid 440B, and an optional hardcoat 440C. The optional hardcoat 440C may or may not be included depending upon the application or whether additional protection is needed. The barrier coated plastic lid 440 may be similar to the barrier coated plastic lid 300 described above with respect to FIG. 3, the detailed description of which applies to the barrier coated plastic lid 440. The OLED 450 and the barrier coated plastic lid 440 may be manufactured separately and/or remotely from one another, and be combined in a subsequent process. Of course, other processes may be used to place the plastic lid 440 on the OLED 450. A benefit of combining the plastic lid 440 with the OLED 450 in a separate operation is that the OLED 450 may be manufactured without concern for damage occurring from the additional steps of building the different layers of the plastic lid on the OLED 450.

Figure 5:
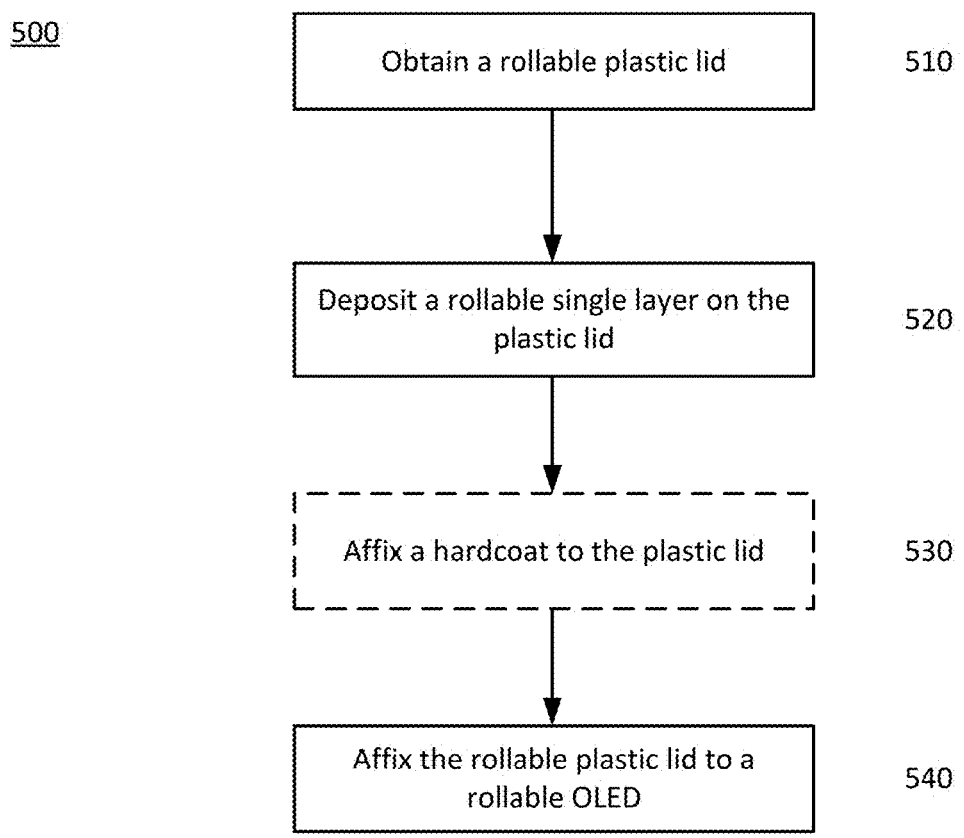
FIG. 5 is a flow chart of a process for fabricating a rollable device of FIG. 4 according to an embodiment of the present invention.

Other processes may be used to manufacture the OLED device 400 including the barrier coated plastic lid 440. For example, FIG. 5 is a flow chart of an example process for fabricating a rollable device 400 according to an embodiment of the present invention.

The process 500 may include obtaining the rollable plastic lid 440B (Step 510) by a fabricating device. The rollable single layer barrier 440A may be combined with the plastic lid 440B by depositing the rollable single layer barrier 440A on the plastic lid 440B (Step 520). The fabrication of the OLED device 400 may be completed by affixing, such as by laminating, the rollable barrier coated plastic lid 440 on to a rollable OLED 450 (Step 540). An optional process step, Step 530, may be performed prior to Step 540. At step 530, a hardcoat 440C may be affixed to the plastic lid 440B. The hardcoat 440C may be affixed to the side of the plastic lid 440B that is opposite the side to which the single layer barrier 440A is disposed. Steps 510 and 520 and optional step 530 of the process 500 may be performed separate and/or at a location different from the location at which step 540 is performed. Other fabricating techniques may be used to assemble the barrier coated plastic lid 450 and the OLED device 400.

Figure 6:
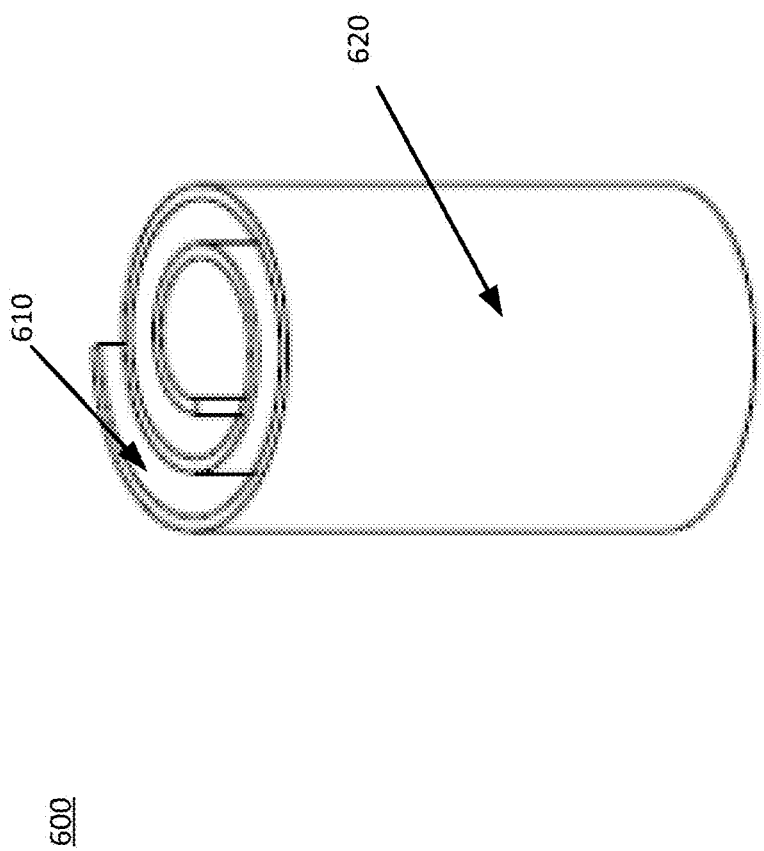
FIG. 6 illustrates a plan view of an OLED including a barrier coated plastic lid according to an embodiment of the present invention.

FIG. 6 illustrates a plan view of a rollable OLED device including a barrier coated plastic lid according to an embodiment of the present invention. In certain embodiments, the OLED device 600 may be a lighting device and/or a display. As a specific example, the OLED device 600 may be a high efficiency, interactive, multi-media display system, and may include an active, viewable area 610 and a back 620. The viewable area 610 may be provided by an OLED with a barrier coated plastic lid as shown in FIG. 4 and described above. Generally it may be preferred for the viewable area 610 to be as bright as possible, with as little power consumption as possible. As depicted in FIG. 6, the OLED device 600 may be a rollable display device. That is, the OLED device 600 can be formed on a rollable substrate, where "rollable" refers to a device capable of being wound around itself more than one revolution as shown in FIG. 6. When the OLED device 600 is rolled around itself more than one revolution as shown, the barrier coated plastic lid on the viewable area 610 may protect the surface of the viewable area 610 from mechanical damage such as scratches that may occur from contact with the back 620 or a foreign material trapped between the viewable area 610 and the back 620. In addition, the barrier coated plastic lid provides improved permeation capabilities due to the presence of the single layer barrier.

Preferably, the OLED device 600 is fabricated from materials that provide a display device or a lighting device capable of obtaining a relatively small radius of curvature, for example in a range of about 3 mm to about 30 cm or more. For example, it may be preferred for the device to be rollable, such that it can be curved to overlap itself more than one complete revolution or more. The viewable area 610 substrate can be formed from a smart material that is flexible. Preferably, the back 620 may also be fabricated on a flexible substrate, such as plastic or thin metal foil. Active-matrix backplanes that are compatible with plastic substrates can be fabricated, and deposited into the flexible substrate. Though active-matrix displays are preferred, it should be understood that passive-matrix displays or other control mechanisms can also be used in accordance with the principles of the invention. OLED display technology is preferred for use on such flexible substrates because of, among other reasons, its very low substrate temperature during deposition, as well as its high brightness at low power levels. Small molecule OLEDs can be used, such as described in U.S. Pat. No. 5,844,363, for example. In addition to the single layer barrier, further encapsulation to prevent moisture and oxygen from permeating through the plastic films and degrading the OLED performance may also be provided, for example, such as disclosed on U.S. Pat. No. 5,771,562. In some configurations, flexible liquid crystal or field emission displays can also be used. For example, a flexible OLED backlight can be used to illuminate a flexible LCD to provide a flexible backlit LCD. Additionally, a flexible display medium, such as "Electronic ink," for example, that is processed into a film for integration into electronic displays can also be used. ("Electronic ink" is proprietary to E Ink Corporation.). OLED technology is preferred because of the very small pixel size that can be attained (such as the so-called "nanopixels," for example).

Devices fabricated in accordance with embodiments of the invention may be incorporated into a wide variety of consumer products, including touchscreens, flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A rollable device, comprising:
   a rollable OLED;
   a rollable plastic lid laminated on to the rollable OLED, the rollable plastic lid comprising:
   a plastic lid layer;
   a single layer barrier disposed on a first side of the plastic lid layer, the single layer barrier to prevent at least one of moisture and oxygen from contacting the OLED; and
   a rollable hardcoat disposed on a second side of the plastic lid layer opposite to the first side to provide mechanical protection,
   wherein the single layer barrier is disposed between the rollable OLED and the the plastic lid layer; and
   wherein the rollable device has a radius of curvature that is less than 30 cm and is capable of being curved to overlap itself more than one complete revolution.

2. The rollable device as recited in claim 1, wherein the rollable OLED is a rollable display.

3. The rollable device as recited in claim 1, wherein the rollable OLED is a rollable lighting device.

4. The rollable device as recited in claim 1, wherein the single layer barrier has a permeation to water of not more than $10^{-5}$ g/m$^2$/day.

5. The rollable device as recited in claim 1, wherein the device is a device type selected from the group consisting of: a touchscreen, a flat panel display, a computer monitor, a medical monitor, a television, a billboard, a general illumination device, a signal, a heads up display, a fully transparent display, a flexible display, a laser printer, a telephone, a cell phone, a personal digital assistant (PDA), a laptop computer, a digital camera, a camcorder, a viewfinder, a microdisplay, a vehicle, a large area wall, a theater, a stadium screen, and a sign.

6. The rollable device as recited in claim 1, further comprising: a display and a light source.

7. A method of fabricating a rollable device, comprising:
   a rollable OLED;
   obtaining a rollable plastic lid;
   depositing a rollable single layer barrier on a first surface of the rollable plastic lid at a first location, the rollable single layer barrier to prevent at least one of moisture and oxygen from contacting the rollable OLED;
   applying a hardcoat on a second surface of the rollable plastic lid opposite to the first surface to provide mechanical protection;
   laminating the rollable plastic lid with the rollable single layer barrier on to the rollable OLED at a second location remote from the first location,
   wherein the single layer barrier is disposed between the rollable OLED and the rollable plastic lid; and
   wherein the rollable device has a radius of curvature that is less than 30 cm and is capable of being curved to overlap itself more than one complete revolution.

8. The method of claim 7, wherein rollable the single layer barrier is in physical contact with the rollable OLED after the plastic lid is laminated on the rollable OLED.

9. The method of claim 7, further comprising:
   applying the hard coat to the rollable plastic lid prior to depositing the rollable single layer barrier on the rollable plastic lid.

10. The method of claim 7, wherein the rollable device is a device type selected from the group consisting of: a touchscreen, a flat panel display, a computer monitor, a medical monitor, a television, a billboard, a general illumination device, a signal, a heads up display, a fully transparent display, a flexible display, a laser printer, a telephone, a cell phone, a personal digital assistant (PDA), a laptop computer, a digital camera, a camcorder, a viewfinder, a microdisplay, a vehicle, a large area wall, a theater, a stadium screen, and a sign.

11. The rollable device of claim 1, wherein the rollable single layer barrier comprises a mixture of a polymeric material and a non-polymeric material.

* * * * *